(12) United States Patent
Imai et al.

(10) Patent No.: US 11,823,861 B2
(45) Date of Patent: Nov. 21, 2023

(54) CHARGED PARTICLE BEAM DEVICE

(71) Applicant: HITACHI HIGH-TECH CORPORATION, Tokyo (JP)

(72) Inventors: Yuta Imai, Tokyo (JP); Junichi Katane, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 82 days.

(21) Appl. No.: 17/617,379

(22) PCT Filed: Jul. 2, 2019

(86) PCT No.: PCT/JP2019/026333
§ 371 (c)(1),
(2) Date: Dec. 8, 2021

(87) PCT Pub. No.: WO2021/001935
PCT Pub. Date: Jan. 7, 2021

(65) Prior Publication Data
US 2022/0254597 A1    Aug. 11, 2022

(51) Int. Cl.
*H01J 37/141* (2006.01)
*H01J 37/244* (2006.01)
*H01J 37/28* (2006.01)

(52) U.S. Cl.
CPC .......... *H01J 37/141* (2013.01); *H01J 37/244* (2013.01); *H01J 37/28* (2013.01); *H01J 2237/04735* (2013.01); *H01J 2237/2448* (2013.01)

(58) Field of Classification Search
CPC ........ H01J 37/141; H01J 37/244; H01J 37/28; H01J 2237/04735; H01J 2237/2448; H01J 2237/1035; H01J 37/145
See application file for complete search history.

(56) References Cited

U.S. PATENT DOCUMENTS

| 5,146,090 A | 9/1992 | Plies |
| 2006/0226360 A1 | 10/2006 | Frosien |

(Continued)

FOREIGN PATENT DOCUMENTS

| JP | H05-036371 A | 2/1993 |
| JP | 2006-093161 A | 4/2006 |

(Continued)

OTHER PUBLICATIONS

International Search Report, PCT/JP2019/026333, dated Sep. 24, 2019 (2 pg.).

*Primary Examiner* — David A Vanore
(74) *Attorney, Agent, or Firm* — Volpe Koenig

(57) ABSTRACT

The invention provides a charged particle beam device that prevents a leakage of an unnecessary magnetic field to a trajectory of a charged particle beam with which a sample is irradiated in a sample observation according to a boosting method. The charged particle beam device includes: a charged particle source configured to generate the charged particle beam with which the sample is irradiated; an object lens configured to generate the magnetic field for focusing the charged particle beam; and a boosting electrode that is provided inside the object lens and to which a voltage for accelerating the charged particle beam is applied. The boosting electrode is formed of a magnetic material.

7 Claims, 7 Drawing Sheets

(56) References Cited

U.S. PATENT DOCUMENTS

| | | | | |
|---|---|---|---|---|
| 2007/0181807 A1* | 8/2007 | Fukuda | ............... | H01J 37/263 |
| | | | | 250/310 |
| 2008/0121803 A1* | 5/2008 | Shojo | ................... | H01J 37/244 |
| | | | | 250/311 |
| 2009/0101817 A1* | 4/2009 | Ohshima | ................ | H01J 37/28 |
| | | | | 250/310 |
| 2009/0256076 A1* | 10/2009 | Fukuda | ................... | H01J 37/28 |
| | | | | 250/311 |
| 2010/0059676 A1* | 3/2010 | Shojo | ..................... | H01J 37/28 |
| | | | | 250/397 |
| 2018/0233320 A1 | 8/2018 | Ikegami et al. | | |

FOREIGN PATENT DOCUMENTS

| | | |
|---|---|---|
| JP | 2006-278329 A | 10/2006 |
| JP | 2014-160678 A | 9/2014 |
| WO | 2017/018432 A1 | 2/2017 |

\* cited by examiner

[FIG. 1]
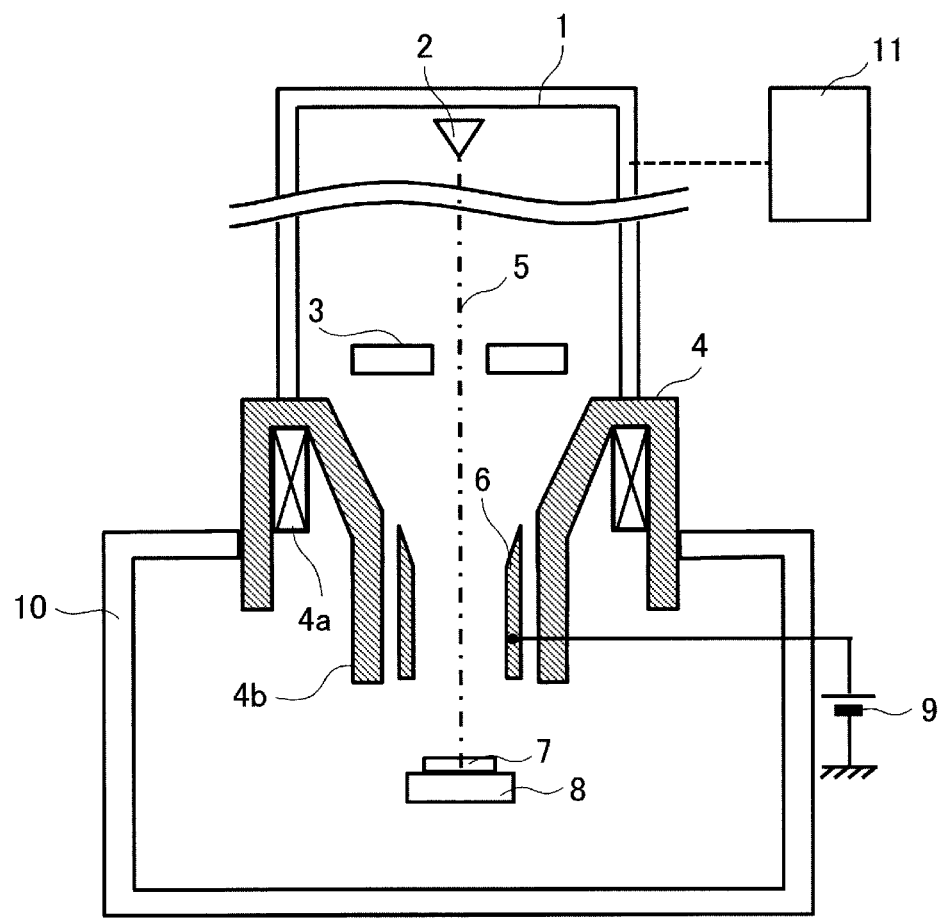

[FIG. 2]
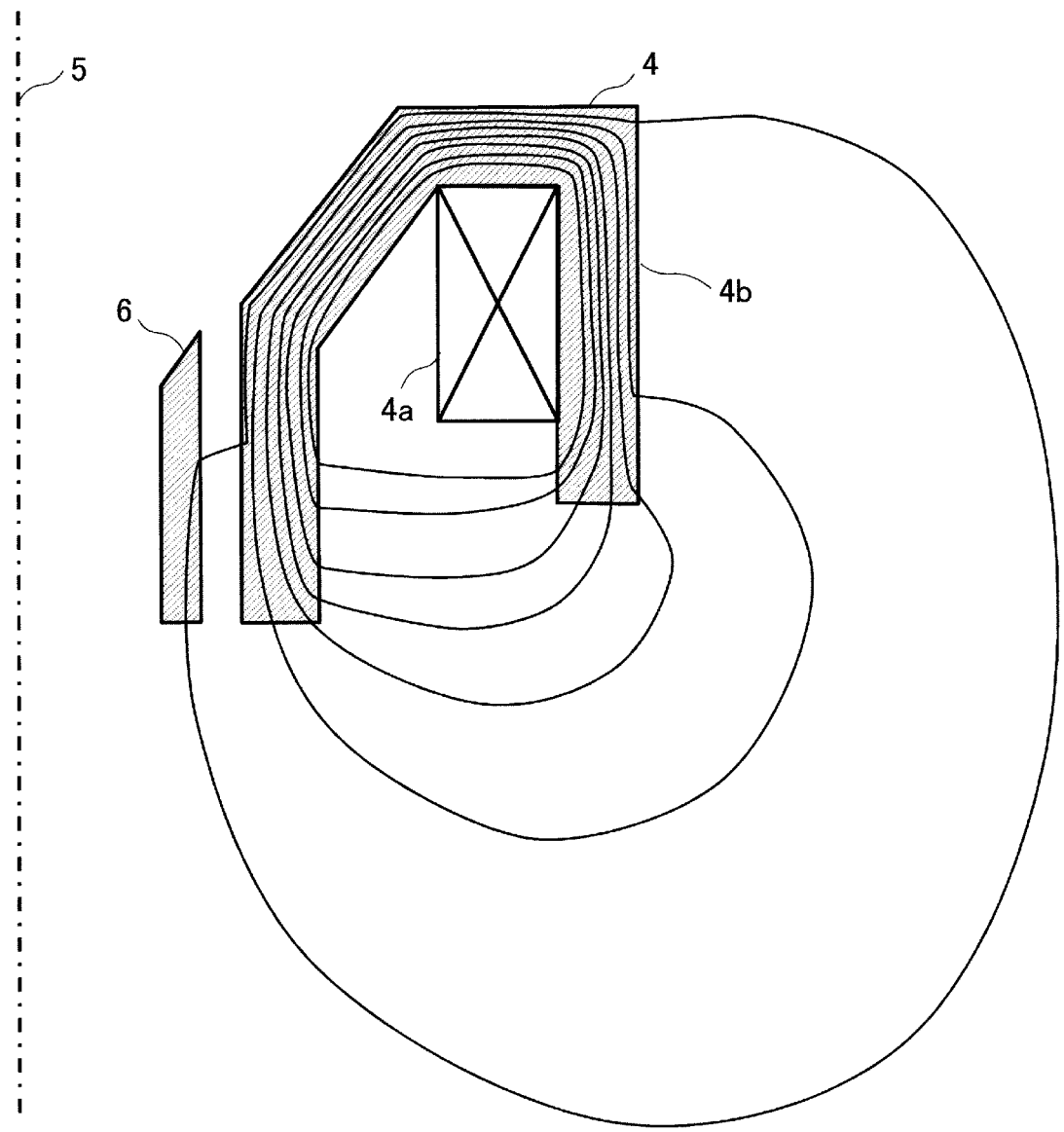

[FIG. 3]
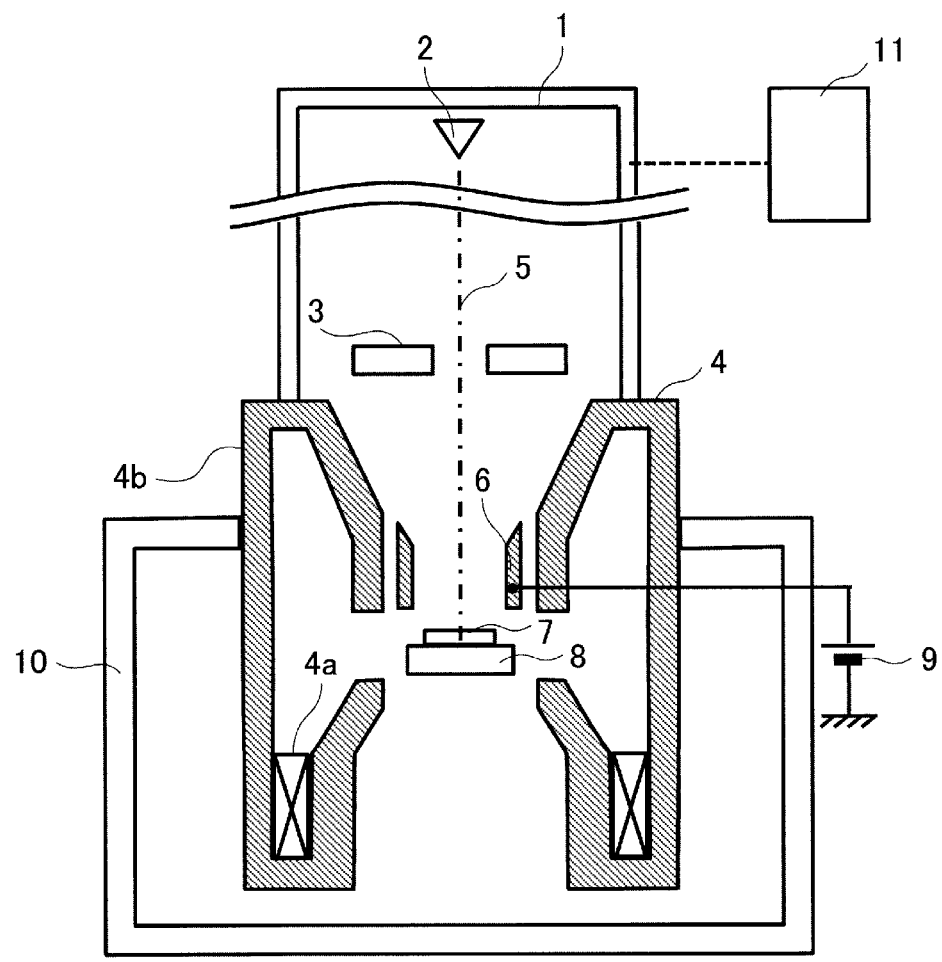

[FIG. 4]
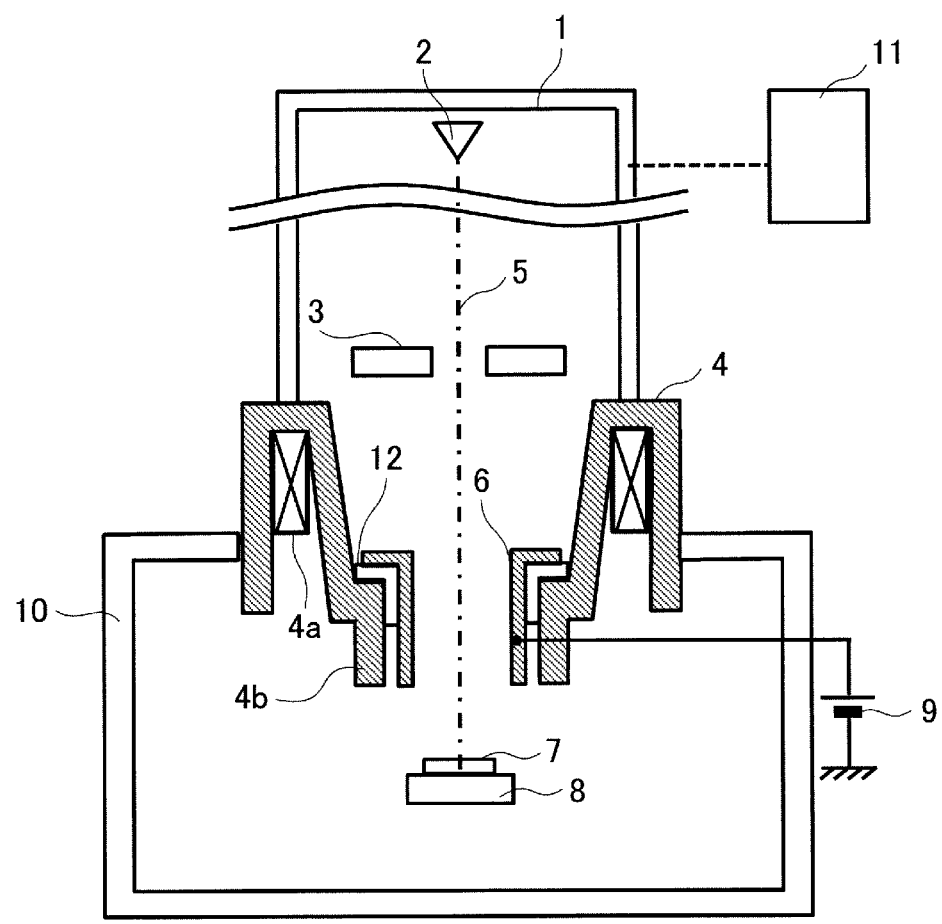

[FIG. 5]
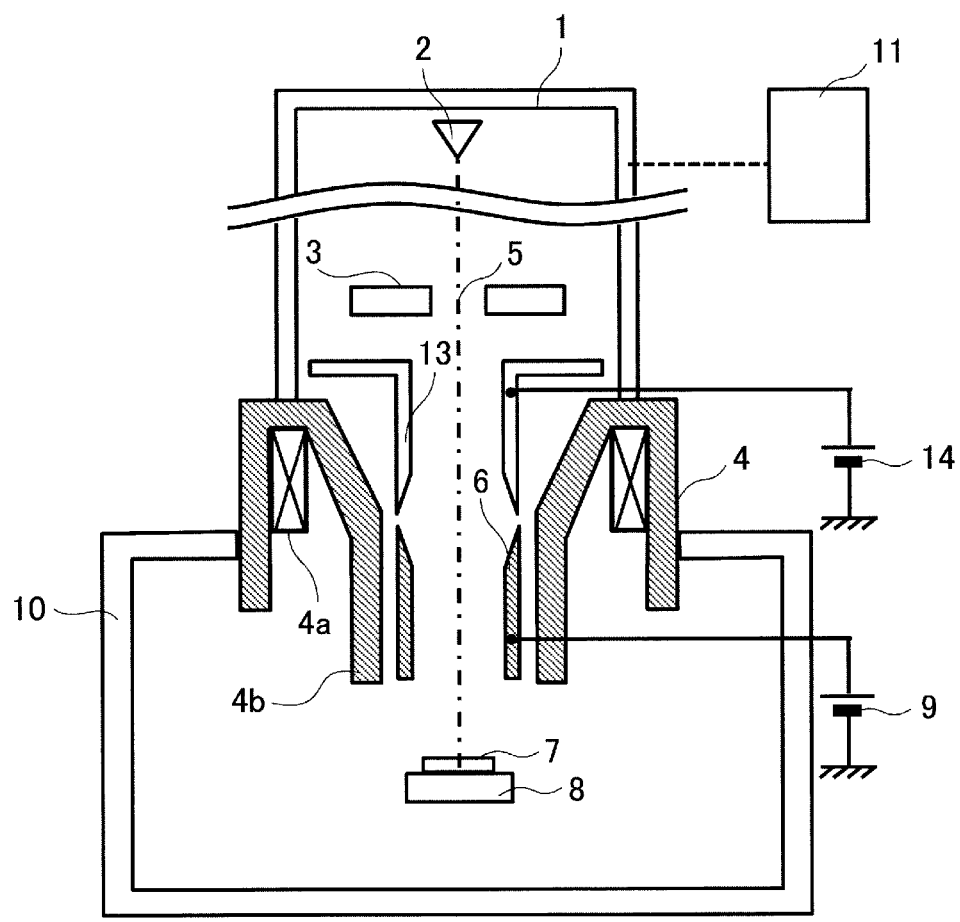

[FIG. 6]
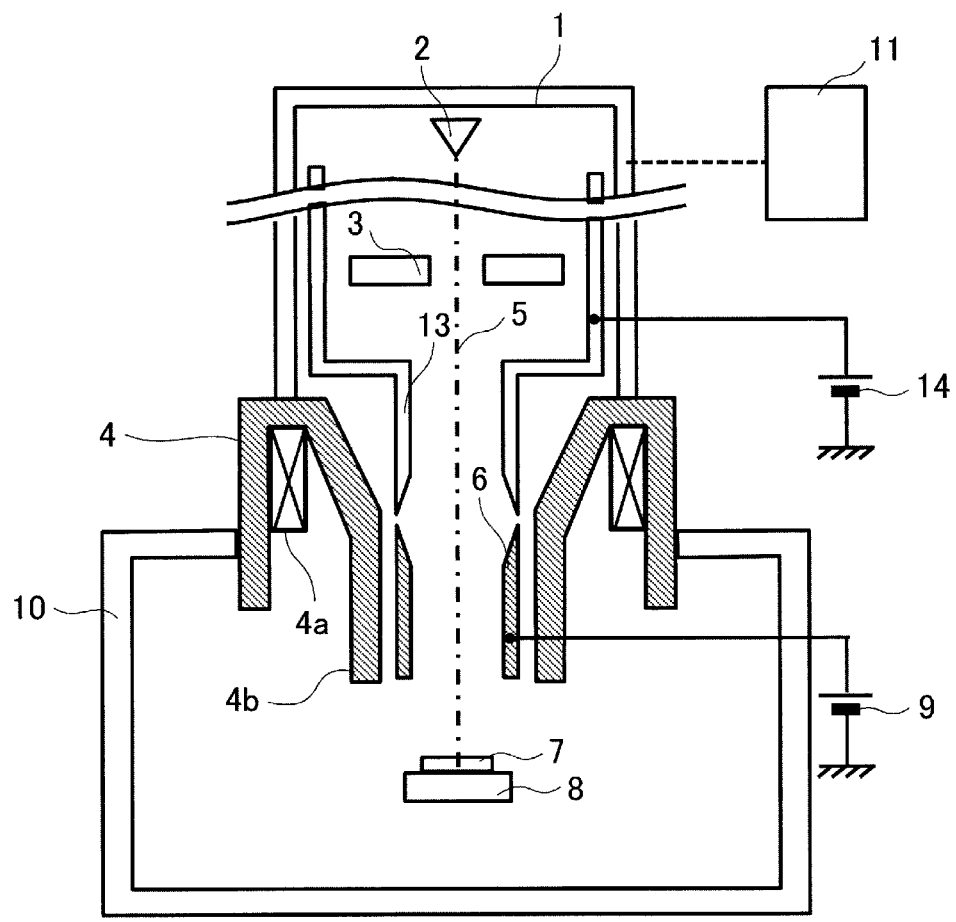

[FIG. 7]
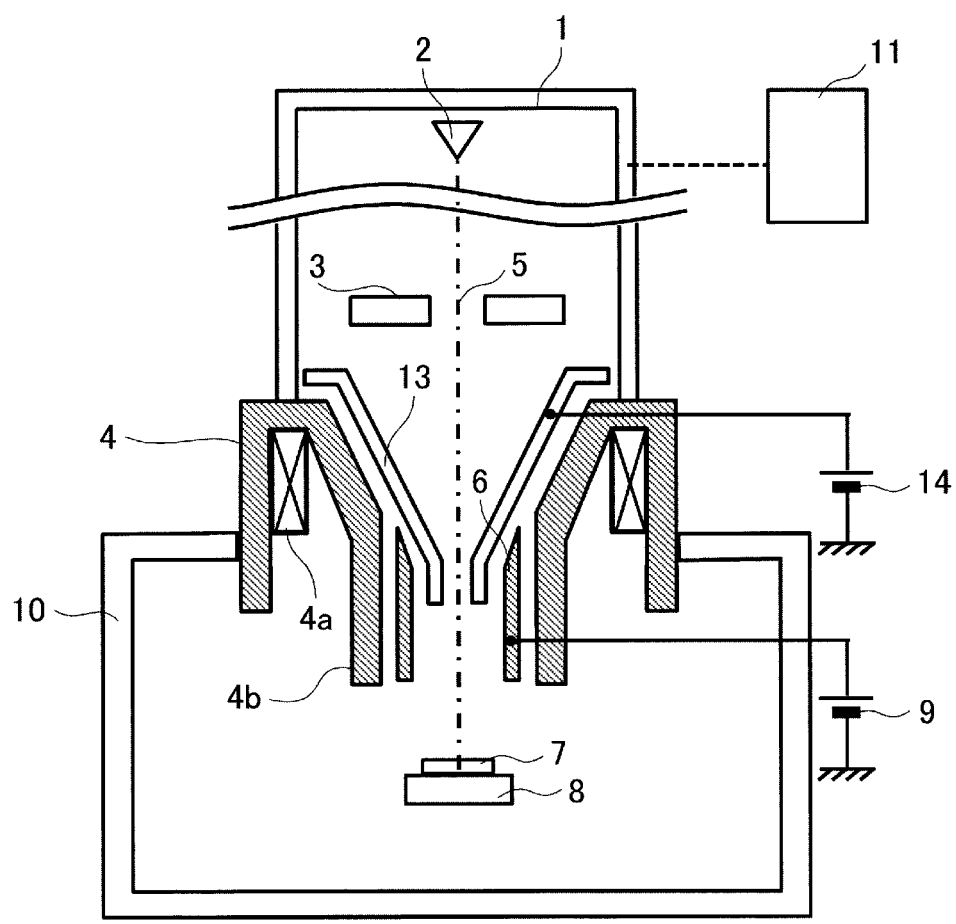

CHARGED PARTICLE BEAM DEVICE

TECHNICAL FIELD

The present invention relates to a charged particle beam device.

BACKGROUND ART

A scanning electron microscope (SEM), which is an example of a charged particle beam device, is used for observing various samples each having a fine structure. In particular, in a dimension measurement, a defect inspection, and the like for a pattern on a semiconductor wafer in a manufacturing process of a semiconductor device, it is required to set an acceleration voltage of an electron beam to 1 kV or less in order to prevent a sample from being charged or damaged. However, reduction of the acceleration voltage increases a chromatic aberration, and thus a spatial resolution of an observation image decreases.

PTL 1 discloses that, in order to obtain an observation image having a high spatial resolution even at a low acceleration voltage, a positive voltage for accelerating an electron beam is applied to a cylindrical electrode disposed in an electron beam passage of an object lens, and a negative voltage for decelerating the electron beam between the cylindrical electrode and a sample is applied to the sample. That is, it is possible to reduce the chromatic aberration according to a boosting method in which the acceleration voltage of the electron beam when passing through the object lens is higher than the acceleration voltage of the electron beam when the sample is irradiated with the electron beam.

CITATION LIST

Patent Literature

PTL 1: JP-A-2006-93161

SUMMARY OF INVENTION

Technical Problem

However, magnetic saturation in a magnetic field generation type object lens is not considered in PTL 1. As a size of the charged particle beam device is reduced, a magnetic path of the object lens is reduced in thickness. A magnetic field may leak to a trajectory of the electron beam due to the magnetic saturation in the thin magnetic path. The leakage of the unnecessary magnetic field to the trajectory of the electron beam causes the electron beam with which the sample is irradiated to blur, thereby reducing the spatial resolution of the observation image.

Accordingly, an object of the invention is to provide a charged particle beam device that prevents a leakage of an unnecessary magnetic field to a trajectory of a charged particle beam with which the sample is irradiated in a sample observation according to a boosting method.

Solution to Problem

In order to achieve the above object, the invention provides a charged particle beam device including: a charged particle source configured to generate a charged particle beam with which a sample is irradiated; an object lens configured to generate a magnetic field for focusing the charged particle beam; and a boosting electrode that is provided inside the object lens and to which a voltage for accelerating the charged particle beam is applied. The boosting electrode is formed of a magnetic material.

Advantageous Effect

According to the invention, it is possible to provide a charged particle beam device that prevents a leakage of the unnecessary magnetic field to the trajectory of the charged particle beam with which the sample is irradiated in the sample observation according to the boosting method.

BRIEF DESCRIPTION OF DRAWINGS

FIG. 1 is a schematic cross-sectional view showing an example of a charged particle beam device according to a first embodiment.

FIG. 2 is a diagram showing an example of a magnetic field distribution generated from an object lens of the charged particle beam device according to the first embodiment.

FIG. 3 is a schematic cross-sectional view showing another example of the charged particle beam device according to the first embodiment.

FIG. 4 is a schematic cross-sectional view showing an example of a charged particle beam device according to a second embodiment.

FIG. 5 is a schematic cross-sectional view showing an example of a charged particle beam device according to a third embodiment.

FIG. 6 is a schematic cross-sectional view showing another example of the charged particle beam device according to the third embodiment.

FIG. 7 is a schematic cross-sectional view showing another example of the charged particle beam device according to the third embodiment.

DESCRIPTION OF EMBODIMENTS

Hereinafter, embodiments of a charged particle beam device according to the invention will be described with reference to the accompanying drawings. The charged particle beam device is a device that observes or processes a sample by irradiating the sample with a charged particle beam represented by an electron beam, and includes various devices such as a scanning electron microscope or a scanning transmission electron microscope. Hereinafter, the scanning electron microscope that observes the sample using the electron beam will be described as an example of the charged particle beam device.

First Embodiment

An overall configuration of a scanning electron microscope according to the present embodiment will be described with reference to FIG. 1. The scanning electron microscope includes a microscope body 1, a sample chamber 10, and a control unit 11. The microscope body 1 includes an electron source 2, a detector 3, an object lens 4, a boosting electrode 6, a focusing lens (not shown), and a deflector (not shown). The sample chamber 10 includes a sample 7 and a sample stage 8. The microscope body 1 and the sample chamber 10 are evacuated by a vacuum pump (not shown).

The electron source 2 is a device that emits electrons and accelerates the electrons to generate an electron beam with which the sample 7 is irradiated. The electron beam generated by the electron source 2 travels along an optical axis 5, is focused by the focusing lens, and is deflected by the deflector. A surface of the sample 7 is two-dimensionally scanned with the electron beam by the deflector performing the deflection.

The object lens 4 is a lens that focuses the deflected electron beam on the surface of the sample 7, and includes a coil 4a and a magnetic path 4b. The coil 4a is an electric wire wound around the optical axis 5 serving as a central axis, and generates a magnetic field that is rotationally symmetric with respect to the optical axis 5 when a direct current flows through the coil 4a. The magnetic path 4b is a magnetic material that surrounds a periphery of the coil 4a and has a gap at a lower side, and has a shape that is rotationally symmetric with respect to the optical axis 5. The magnetic field generated by the coil 4a is concentrated in the magnetic path 4b and leaks from the gap at the lower side to form a lens that focuses the electron beam. The lens that leaks, from the gap at the lower side of the magnetic path 4b, the magnetic field for focusing the electron beam is called a semi-in-lens type object lens.

The boosting electrode 6 is a cylindrical electrode provided inside the object lens 4. A boosting voltage, which is a voltage for further accelerating the electron beam, is applied from a boosting power supply 9 to the boosting electrode 6. The electron beam when passing through the object lens 4 is accelerated by the application of the boosting voltage to the boosting electrode 6, and thus a chromatic aberration is reduced. A gap is formed between the boosting electrode 6 and the object lens 4 in order to maintain insulation between the boosting electrode 6 and the object lens 4.

The sample stage 8 is a device that mounts the sample 7, moves the sample 7 three-dimensionally, rotates the sample 7 around the optical axis 5 serving as a rotation axis, or inclines the sample 7. An electric field for decelerating the electron beam is formed between the sample 7 and the boosting electrode 6. The sample 7 can be prevented from being charged or damaged by irradiating the sample 7 with the decelerated electron beam.

The detector 3 is a device that detects secondary particles such as secondary electrons and reflected electrons emitted from the sample 7 by irradiating the sample 7 with the electron beam. A detection signal of the detector 3 is transmitted to the control unit 11 and used to generate an observation image of the sample 7.

The control unit 11 is a device that controls each unit of the scanning electron microscope, and is implemented by, for example, a general-purpose computer. The computer includes at least a processor such as a central processing unit (CPU), a storage unit such as a memory, and a storage device such as a hard disk drive (HDD). Processing executed by the control unit 11 may be executed by loading a program stored in the HDD into a memory and executing the program by the CPU. A part of the control unit 11 may be implemented by hardware such as a dedicated circuit board. The control unit 11 generates and displays the observation image based on the detection signal transmitted from the detector 3.

When the magnetic path 4b of the object lens 4 is reduced in thickness as a size of the scanning electron microscope is reduced, an unnecessary magnetic field may leak to the optical axis 5 which is an axis of a trajectory of the electron beam due to a magnetic saturation in the magnetic path 4b. The leakage of the unnecessary magnetic field to the optical axis 5 causes the electron beam with which the sample 7 is irradiated to blur, thereby reducing a spatial resolution of the observation image. Therefore, in the present embodiment, it is possible to prevent the leakage of the unnecessary magnetic field to the optical axis 5 by forming the boosting electrode 6 with a magnetic material.

An example of distribution of the magnetic field generated from the object lens 4 will be described with reference to FIG. 2. The distribution of the magnetic field is rotationally symmetric with respect to the optical axis 5, and thus only a right half of the object lens 4 and the boosting electrode 6 is shown in FIG. 2. Even though the magnetic field generated from the object lens 4 leaks from the magnetic path 4b to an optical axis 5 side, since the magnetic field remains to pass through the boosting electrode 6 formed of the magnetic material, it is possible to prevent the leakage of the unnecessary magnetic field to the optical axis 5.

When the boosting electrode 6 protrudes toward a sample 7 side with respect to the object lens 4, the magnetic field is concentrated on a protruding portion, and an unnecessary magnetic field may leak from the boosting electrode 6 to the optical axis 5 due to a magnetic saturation of the boosting electrode 6. Therefore, it is desirable that the boosting electrode 6 does not protrude toward the sample 7 side with respect to the object lens 4, and for example, end portions of the boosting electrode 6 and the object lens 4 on the sample 7 side are set to the same position in a direction of the optical axis 5 as shown in FIGS. 1 and 2.

When the boosting electrode 6 protrudes toward an electron source 2 side with respect to the object lens 4, a stray magnetic field such as a ground magnetic field may be concentrated on the protruding portion and a noise component may be generated. Therefore, it is desirable that the boosting electrode 6 does not protrude toward the electron source 2 side with respect to the object lens 4. Further, a lens due to an acceleration electric field is formed at an end portion, on the electron source 2 side, of the boosting electrode 6 to which the boosting voltage is applied. In order to reduce the chromatic aberration of the electron beam, it is better to bring a main surface of the lens formed by the acceleration electric field closer to the sample 7, and thus it is desirable that the end portion of the boosting electrode 6 on the electron source 2 side is brought close to the sample 7. That is, when the end portions of the boosting electrode 6 and the object lens 4 on the sample 7 side are at the same position in the direction of the optical axis 5, it is desirable that a length of the boosting electrode 6 in the direction of the optical axis 5 is shorter.

Another example of the scanning electron microscope according to the present embodiment will be described with reference to FIG. 3. In FIGS. 1 and 2, the semi-in-lens type object lens has been described. In FIG. 3, an in-lens type object lens in which the sample 7 is disposed in the object lens 4 will be described. A shape of the magnetic path 4b of the object lens 4 in FIG. 3 is different from that in FIG. 1, and a gap is formed toward an inside. In the in-lens type object lens, the chromatic aberration of the electron beam can be reduced by disposing the sample 7 in a lens formed by a magnetic field leaking from the gap formed toward the inside.

Also in the in-lens type object lens in FIG. 3, since the boosting electrode 6 is formed of the magnetic material, even though the magnetic field of the object lens 4 leaks from the magnetic path 4b, the magnetic field of the object lens 4 remains to pass through the boosting electrode 6. Therefore, it is possible to prevent the leakage of the unnecessary magnetic field to the optical axis 5. In order to prevent the concentration of the magnetic field to the boosting electrode 6, it is desirable that the end portion of the boosting electrode 6 on the sample 7 side does not protrude toward the sample 7 side with respect to the gap formed at the inside of the magnetic path 4b.

Similarly to FIG. 1, it is desirable that the end portion of the boosting electrode 6 on the electron source 2 side does not protrude toward the electron source 2 side with respect to the object lens 4. Further, similarly to FIG. 1, it is desirable that the length of the boosting electrode 6 in the direction of the optical axis 5 is shorter.

According to the scanning electron microscope in the present embodiment described above, it is possible to prevent the leakage of the unnecessary magnetic field to the trajectory of the electron beam with which the sample 7 is irradiated in a sample observation according to a boosting method. As a result, since it is possible not to blur the electron beam with which the sample 7 is irradiated and it is possible to reduce the chromatic aberration, the spatial resolution of the observation image can be improved.

Second Embodiment

In the first embodiment, it has been described that the gap is formed between the boosting electrode 6 and the object lens 4 to maintain the insulation between the boosting electrode 6 and the object lens 4. In the present embodiment, it will be described that a solid insulator is interposed between the boosting electrode 6 and the object lens 4 to maintain the insulation between the boosting electrode 6 and the object lens 4. The same reference numerals are given to the components having the same functions as in the first embodiment, and the description thereof will be omitted.

An overall configuration of a scanning electron microscope according to the present embodiment will be described with reference to FIG. 4. In the present embodiment, an insulator 12 is disposed between the boosting electrode 6 and the object lens 4. The insulator 12 maintains the insulation between the boosting electrode 6 and the object lens 4, and fixes the boosting electrode 6 to the object lens 4. An axis of the object lens 4 and an axis of the boosting electrode 6 can easily coincide with each other by fixing the boosting electrode 6 to the object lens 4 via the insulator 12, and axial accuracy can be improved. Therefore, the blurring of the electron beam caused by an axis deviation can be reduced.

Also in the present embodiment, since the boosting electrode 6 is formed of the magnetic material, even though the magnetic field of the object lens 4 leaks from the magnetic path 4b, the magnetic field of the object lens 4 remains to pass through the boosting electrode 6. Therefore, it is possible to prevent the leakage of the unnecessary magnetic field to the optical axis 5. In order to prevent an adverse influence due to a magnetic saturation of the insulator 12, it is desirable that the insulator 12 is a non-magnetic material.

According to the scanning electron microscope in the present embodiment described above, it is possible to prevent the leakage of the unnecessary magnetic field to the trajectory of the electron beam with which the sample is irradiated, and thus it is possible to improve the spatial resolution of the observation image in the sample observation according to the boosting method. Further, according to the present embodiment, since the axial accuracy of the object lens 4 and the boosting electrode 6 can be improved, the spatial resolution of the observation image can be further improved. The insulator 12 according to the present embodiment can be applied not only to the semi-in-lens type object lens but also to the in-lens type object lens exemplified in FIG. 2.

Third Embodiment

In the first embodiment, it has been described that the boosting voltage is applied to the boosting electrode 6 formed of the magnetic material to reduce the chromatic aberration of the electron beam. Since the lens formed by the acceleration electric field formed at the end portion, on the electron source 2 side, of the boosting electrode 6 to which the boosting voltage is applied increases the chromatic aberration of the electron beam, it is desirable to reduce the influence of the lens. Therefore, in the present embodiment, it will be described that an electrode is added between the boosting electrode 6 and the electron source 2 in order to reduce the influence of the lens formed by the acceleration electric field formed at the end portion of the boosting electrode 6 on the electron source 2 side. The same reference numerals are given to the components having the same functions as in the first embodiment, and the description thereof will be omitted.

An overall configuration of a scanning electron microscope according to the present embodiment will be described with reference to FIG. 5. In the present embodiment, an auxiliary electrode 13 is added between the boosting electrode 6 and the electron source 2. The auxiliary electrode 13 has a shape that is rotationally symmetric with respect to the optical axis 5, and is applied with a voltage from an auxiliary power supply 14. An auxiliary voltage, which is the voltage applied from the auxiliary power supply 14, is a voltage lower than the boosting voltage. It is desirable that the auxiliary voltage is higher than a voltage of the object lens 4. For example, when the boosting voltage is 2 kV, the voltage of the object lens 4 is a ground voltage, and the acceleration voltage of the electron source 2 is 100 V, the auxiliary voltage is set to 200 V.

By applying the auxiliary voltage from the auxiliary power supply 14 to the auxiliary electrode 13, the electron beam is accelerated stepwise by the auxiliary voltage, which is the voltage lower than the boosting voltage, and the boosting voltage. As a result, it is possible to reduce the influence of the lens formed by the acceleration electric field formed at the end portion of the boosting electrode 6 on the electron source 2 side, and thus it is possible to reduce the chromatic aberration of the electron beam.

Also in the present embodiment, since the boosting electrode 6 is formed of the magnetic material, even though the magnetic field of the object lens 4 leaks from the magnetic path 4b, the magnetic field of the object lens 4 remains to pass through the boosting electrode 6. Therefore, it is possible to prevent the leakage of the unnecessary magnetic field to the optical axis 5. When the auxiliary electrode 13 is a magnetic material, a lens is formed due to concentration of the magnetic field between the auxiliary electrode 13 and the boosting electrode 6, and the aberration may be increased. Therefore, it is desirable that the auxiliary electrode 13 is a non-magnetic material.

Another example of the scanning electron microscope according to the present embodiment will be described with reference to FIG. 6. In FIG. 6, the auxiliary electrode 13 is extended toward the electron source 2 side. It is desirable that the auxiliary electrode 13 is extended to a vicinity of the electron source 2. The detector 3 is provided in a region where the auxiliary electrode 13 is disposed.

In the region where the auxiliary electrode 13 is disposed, since the electron beam is accelerated by the auxiliary voltage, the electron beam is less likely to be affected by noise and deflection due to an electromagnetic field from an outside, and the blurring of the electron beam can be reduced. The detector 3 is disposed in the region of the auxiliary electrode 13 to which the auxiliary voltage is applied, so that the secondary particles emitted from the sample 7 are likely to enter the detector 3. Therefore, detection sensitivity can be improved.

Another example of the scanning electron microscope according to the present embodiment will be described with reference to FIG. 7. In FIG. 7, an end portion of the auxiliary electrode 13 on the sample 7 side is disposed closer to the sample 7 side than is the end portion of the boosting electrode 6 on the electron source 2 side. It is desirable that the end portion of the auxiliary electrode 13 on the sample 7 side is disposed inside the end portion of the boosting electrode 6 on the electron source 2 side.

When the boosting electrode 6 and the auxiliary electrode 13 are disposed as shown in FIG. 7, the lens formed by the acceleration electric field is formed at the end portion of the auxiliary electrode 13 on the sample 7 side, and the main surface of the lens is closer to the sample 7. Therefore, it is possible to further reduce the chromatic aberration of the electron beam.

According to the scanning electron microscope in the present embodiment described above, it is possible to prevent the leakage of the unnecessary magnetic field to the trajectory of the electron beam with which the sample 7 is irradiated, and thus it is possible to improve the spatial resolution of the observation image in the sample observation according to the boosting method. Further, according to the present embodiment, since it is possible to reduce the influence of the lens formed by the acceleration electric field formed at the end portion of the boosting electrode 6 on the electron source 2 side, it is possible to further reduce the chromatic aberration of the electron beam, and to further improve the spatial resolution of the observation image. The auxiliary electrode 13 according to the present embodiment can be applied not only to the semi-in-lens type object lens but also to the in-lens type object lens exemplified in FIG. 2.

As described above, a plurality of embodiments of the charged particle beam device according to the invention has been described. The invention is not limited to the above-described embodiments, and can be embodied by modifying constituent elements without departing from a spirit of the invention. A plurality of constituent elements disclosed in the above-described embodiments may be appropriately combined. Further, some constituent elements may be deleted from all the constituent elements shown in the above-described embodiments.

REFERENCE SIGN LIST 1 microscope body
2 electron source
3 detector
4 object lens
4a coil
4b magnetic path
5 optical axis
6 boosting electrode
7 sample
8 sample stage
9 boosting power supply
10 sample chamber
11 control unit
12 insulator
13 auxiliary electrode
14 auxiliary power supply

The invention claimed is:

1. A charged particle beam device including
a charged particle source configured to generate a charged particle beam with which a sample is irradiated;
an object lens configured to generate a magnetic field for focusing the charged particle beam;
a boosting electrode that is provided inside the object lens and to which a voltage for accelerating the charged particle beam is applied; and
an auxiliary electrode which is an electrode disposed between the boosting electrode and the charged particle source, wherein
the boosting electrode is formed of a magnetic material,
a voltage applied to the auxiliary electrode is lower than a voltage applied to the boosting electrode, and
an end portion of the auxiliary electrode on a sample side is disposed closer to the sample side than is an end portion of the boosting electrode on a charged particle source side, and the end portion is disposed inside the boosting electrode.

2. The charged particle beam device according to claim 1, wherein
the boosting electrode does not protrude toward the sample side with respect to the object lens.

3. The charged particle beam device according to claim 1, wherein
the boosting electrode does not protrude toward the charged particle source side with respect to the object lens.

4. The charged particle beam device according to claim 1, wherein
the boosting electrode is fixed to the object lens by a member which is an insulator and which is a non-magnetic material.

5. The charged particle beam device according to claim 1, wherein
the auxiliary electrode is formed of a non-magnetic material.

6. The charged particle beam device according to claim 1, further comprising:
a detector configured to detect secondary particles emitted from the sample in a region where the auxiliary electrode is disposed.

7. The charged particle beam device according to claim 1, wherein
the auxiliary electrode completely covers a space between the boosting electrode and the charged particle source.

* * * * *